United States Patent

[11] 3,624,530

[72] Inventor Robert Zwirn
Los Angeles, Calif.
[21] Appl. No. 844,890
[22] Filed July 25, 1969
[45] Patented Nov. 30, 1971
[73] Assignee Hughes Aircraft Company
Culver City, Calif.

[54] ELECTRONICALLY CONTROLLED VARIABLE RESISTANCE DEVICE
8 Claims, 4 Drawing Figs.

[52] U.S. Cl. .......... 330/3, 330/24, 330/26, 330/30 R, 330/35, 323/8
[51] Int. Cl. .......... H03f 5/00, H03f 21/00
[50] Field of Search .......... 330/147, 35, 3; 333/80; 323/8, 15, 22 T, 73, 35

[56] References Cited

UNITED STATES PATENTS 2,863,049 12/1958 Lee et al. .......... 330/147 X
2,968,768 1/1961 Volkers .......... 330/147 X
3,017,578 1/1962 Lundry .......... 330/147 X
2,220,415 11/1940 La Rogue .......... 323/35 X

OTHER REFERENCES

RCA, Technical Notes, Princeton, N.J. TN No. 783 10–2–68 4 sheets, Shunt Type Voltage Regulator by Paul S. Nekrasov copy in 307–297 and 323–15

*Primary Examiner*—Nathan Kaufman
*Attorneys*—James K. Haskell and Paul M. Coble

ABSTRACT: A resistor and a plurality of electrical circuit branches are connected in parallel, each branch including a resistor connected in series with the source-drain path of a field effect transistor. Respective outputs from a plurality of control amplifiers, each including an operational amplifier and responsive to a common master control voltage and a different reference voltage, are applied to respective gate electrodes of the field effect transistors. Each control amplifier provides a linearly varying field effect transistor control voltage over a preselected range of the master control voltage and first and second essentially constant field effect transistor control voltages when the master control voltage is respectively below and above the preselected voltage range.

PATENTED NOV 30 1971 3,624,530

SHEET 1 OF 2

INVENTOR
ROBERT ZWIRN,
BY
Paul M. Coble
ATTORNEY.

ELECTRONICALLY CONTROLLED VARIABLE RESISTANCE DEVICE

This invention relates to electronics, and more particularly relates to an electronic circuit for providing a preselected variable resistance as determined by an applied master control voltage.

One type of prior art controllable resistance device which has been employed utilizes electromechanically driven potentiometers. Since such potentiometers usually require a relatively elaborate, bulky and slow-acting drive system including a servomotor, gearing, clutches, switches, etc., electromechanically controlled variable resistance devices are impractical for many electronic applications.

Prior art electronically controlled variable resistance devices have been used which are smaller, lighter, faster acting, and which require less power than electromechanically driven variable resistance devices. Examples of such electronically controlled resistance devices are the field effect transistor, the channel resistance of which is controlled by an applied gate voltage; and the Raysistor, the resistance of which varies in accordance with incident light from a voltage-controlled lamp. When individual electronic devices of this type are employed as variable resistances, the resistance corresponding to a given control voltage may vary significantly between individual devices. Thus, the predictability and uniformity of the resultant resistance versus control voltage characteristic are low. Moreover, the resistance provided by such devices is highly sensitive to temperature.

Accordingly, it is an object of the present invention to provide a controllable resistance device which is smaller, lighter, faster acting, more reliable and which consumes less power than electromechanically driven variable resistance devices, and at the same time which provides a far more predictable and uniform resistance versus control voltage characteristic than prior art electronically controlled variable resistance devices.

It is a further object of the present invention to provide an electronically controlled variable resistance device which is substantially less sensitive to temperature than electronically controlled variable resistance devices of the prior art.

In accordance with the foregoing objects, an electronically controlled variable impedance device according to the invention includes a plurality of electrical circuit branches connected in parallel. At least certain of the branches include a controllable impedance element connected in series with a preselected impedance. A plurality of control amplifiers responsive to a common master control voltage have their respective outputs coupled to respective controllable impedance elements. Each control amplifier provides a variable control voltage for the associated controllable impedance element over a preselected range of the master control voltage and provides first and second essentially constant control voltages for the associated controllable impedance element when the master control voltage is respectively below and above the preselected voltage range.

Additional objects, advantages and characteristic features of the invention will become readily apparent from the following detailed description of a preferred embodiment of the invention when considered in conjunction with the accompanying drawing in which.

Figure 1:
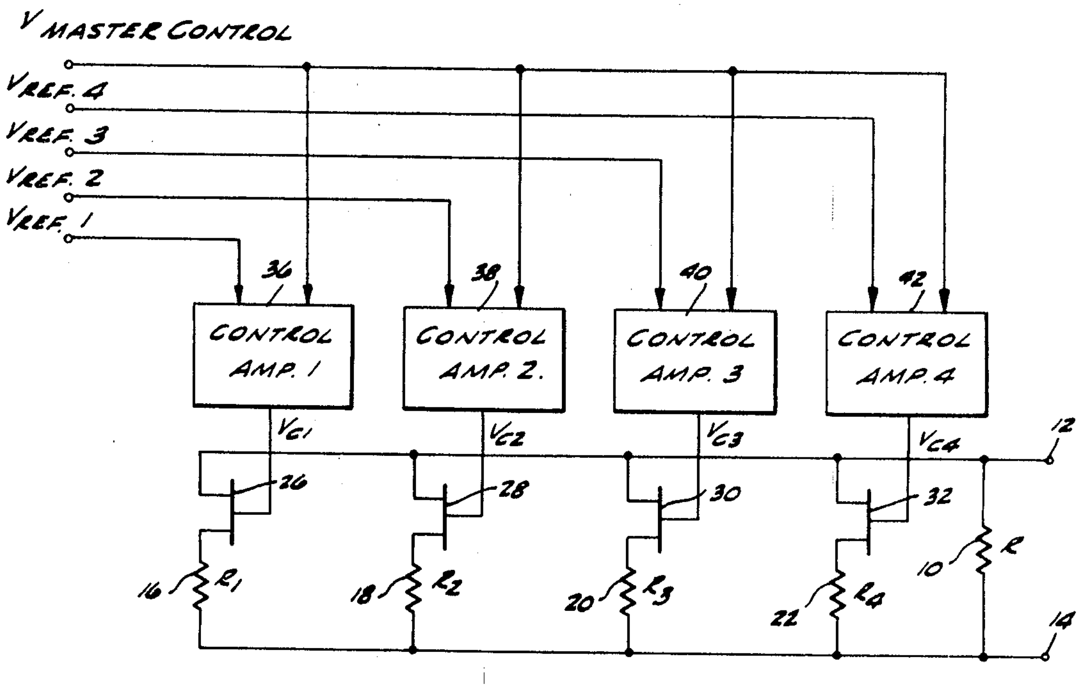
FIG. 1 is a diagram, partly in schematic circuit form and partly in block form, illustrating an electronically controlled variable resistance device in accordance with the invention.

FIG. 4*a* is a graph showing the output voltages from the respective control amplifiers of FIG. 1 as a function of a master control voltage; and FIG. 4*b* is a graph illustrating the overall resistance of the device of FIG. 1 as a function of the master control voltage.

Referring to FIG. 1 with greater particularity, an electronically controlled variable resistance device according to the invention may be seen to include a fixed resistor 10 connected directly between terminals 12 and 14 of the variable resistance device and a plurality of additional fixed resistors 16, 18, 20 and 22 each adapted to be selectively effectively connected or disconnected between the terminals 12 and 14 in parallel with resistor 10. Although five resistors are shown, this number is purely illustrative, and any practical number of resistors may be used within the principles of the invention. Resistor 10 provides a preselected resistance value R, while resistors 16, 18, 20 and 22 provide preselected respective resistance values $R_1$, $R_2$, $R_3$ and $R_4$. As an example, typical resistance values which may be employed are:

$R$=3.3 kΩ
$R_1$=200 ohms
$R_2$=620 ohms
$R_3$=1.5 kΩ
$R_4$=3.0 kΩ

It is pointed out that the foregoing values are set forth solely for illustrative purposes, and other resistance value are equally suitable.

In order to selectively effectively connect and disconnect resistors 16, 18, 20 and 22 into the device, a controllable impedance element is connected in series with each of these resistors. In a preferred embodiment of the invention illustrated in FIG. 1 the controllable impedance elements are field effect transistors 26, 28, 30 and 32 having their respective source-drain paths connected in series with respective resistors 16, 18, 20 and 22 between terminals 12 and 14. However, other controllable impedance elements, such as Raysisters, may be employed instead of field effect transistors. The field effect transistors 26, 28, 30 and 32 are preferably of the metal-oxide-silicon (MOS FET) type. An example of a particular transistor which may be used in an FN 1034 MOS FET manufactured by Raytheon Co., although other MOS FETs are also suitable.

The field effect transistors 26, 28, 30 and 32 are rendered conductive and nonconductive by respective control voltages $V_{c1}$, $V_{c2}$, $V_{c3}$ and $V_{c4}$ applied to the respective gate electrodes of the transistors 26, 28, 30 and 32. The control voltages $V_{c1}$, $V_{c2}$, $V_{c3}$ and $V_{c4}$ are generated by first, second, third and fourth control amplifiers 36, 38, 40 and 42, respectively. Each control amplifier is designed so that its output voltage (control voltage $V_{c1}$, $V_{cw}$, $V_{c3}$ or $V_{c4}$) is effective to change the conductive condition of the associated field effect transistor over a different range of a common master control voltage $V_{MASTER\ CONTROL}$ which is applied as one input to each of the control amplifiers 36, 38, 40 and 42. The voltage range over which each control amplifier is effective to change the conductive condition of the associated field effect transistor is determined by a reference voltage applied as a second input to the control amplifier and by the gain of the control amplifier. Specifically, reference voltages $V_{ref.1}$, $V_{ref.2}$, $V_{ref.3}$ and $V_{ref.4}$ are applied to respective second inputs to control amplifiers 36, 38, 40 and 42, respectively.

Figure 2:
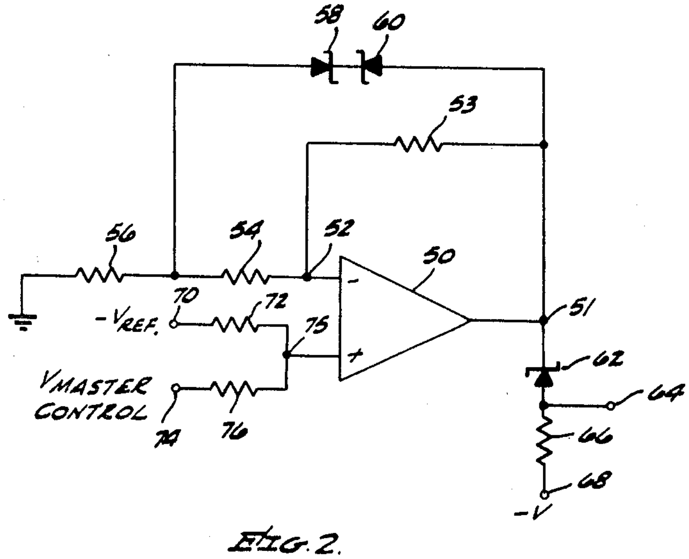
FIG. 2 is a schematic circuit diagram illustrating a typical control amplifier of the device of FIG. 1.

Each of the control amplifiers 36, 38, 40 and 42 is of the same circuit configuration, and which configuration is shown in FIG. 2. As may be seen from FIG. 2, the control amplifier includes an operational amplifier 50 which is connected in a noninverting configuration. An exemplary operational amplifier which may be employed for the amplifier 50 is a $\mu$A709 operational amplifier manufactured by Fairchild Semiconductor, although other operational amplifiers are also suitable. Connected between output terminal 51 and inverting input terminal 52 of the operational amplifier 50 is a feedback resistor 53. A pair of resistors 54 and 56 are connected in series between inverting input terminal 52 and a level of reference potential illustrated as ground. A pair of voltage limiting zener diodes 58 and 60 are connected in series in opposite polarity between the operational amplifier output terminal 51 and the junction between resistors 54 and 56. A voltage level shifting zener diode 62 is connected between operational amplifier output terminal 51 and a terminal 64 which functions as the output terminal from the control amplifier, and which terminal furnishes the control voltage $V_c$ to the associated field effect transistor. A load resistor 66 is connected between terminal 64 and a terminal 68 furnishing a power supply voltage $-V$, which may be $-30$ volts for example. The zener diode 62 is connected in such polarity as to be back-biased for the particular voltage polarities used in the circuit. In the particular exemplary circuit being described, the zener diodes 58, 60 and 62 are selected to sustain a back-bias voltage of approximately $-10$ volts between their anode and cathode.

The master control voltage $V_{MASTER\ CONTROL}$ and a voltage $-V_{ref.}$ equal to the negative of the reference voltage $V_{ref.}$ are applied to the operational amplifier 50 via a voltage dividing network having a center tap connected to noninverting input terminal 75 of the operational amplifier 50. Specifically, the voltage $-V_{ref.}$ may be applied to terminal 70 which is connected via a resistor 72 to the operational amplifier noninverting input terminal 75, while the master control voltage $V_{MASTER\ CONTROL}$ may be applied to a terminal 74 which is connected to the noninverting input terminal 75 via a resistor 76 providing the same resistance as resistor 72.

The operation of the electronically controlled resistance device of FIG. 1 will now be described with reference to the graphs of FIGS. 3 and 4. When the master control voltage $V_{MASTER\ CONTROL}$ is at 0 volts, each of the control amplifiers 36, 38, 40 and 42 provides an output voltage of approximately $-20$ volts, as shown by respective curve portions 77, 78, 79 and 80 of FIG. 4a. The manner in which this output voltage is generated is as follows. A voltage equal to $-V_{ref.}/2$ is applied to the noninverting input terminal 75 of operational amplifier 50, and since the operational amplifier gain is large, a large negative voltage would appear at operational amplifier output terminal 51. However, the limiting action of Zener diode 60 limits the voltage at terminal 51 to around $-10$ volts. An additional approximately $-10$ volts across level shifting zener diode 62 results in an overall control amplifier output voltage at terminal 64 of around $-20$ volts.

Figures 3, 4:
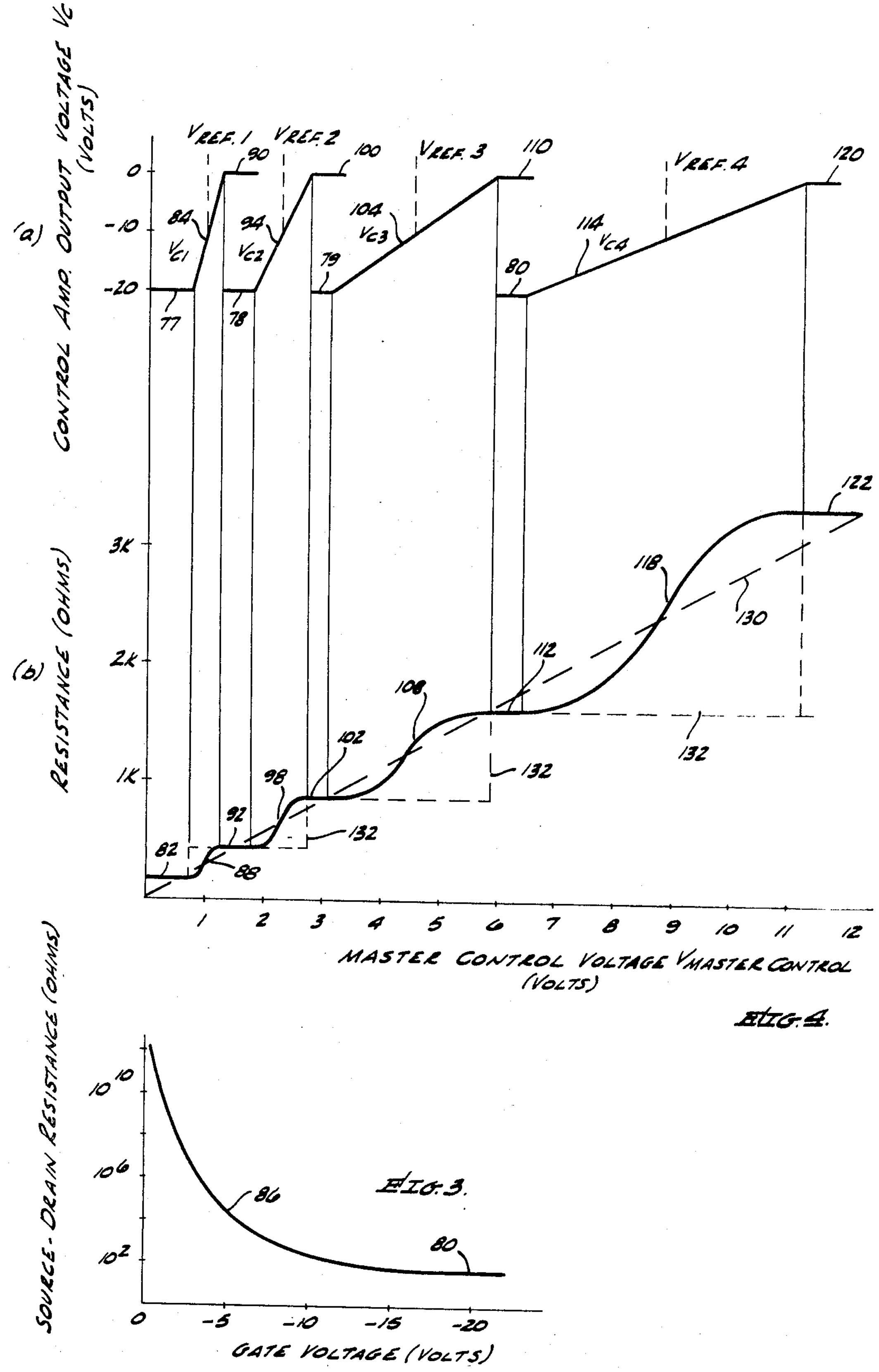
FIG. 3 is a graph depicting the source-drain resistance as a function of gate voltage for a typical field effect transistor used in the device of FIG. 1.

As may be seen from FIG. 3, when the control voltage $V_c$ applied to the gate electrode of any of the field effect transistors 26, 28, 30 or 32 is around $-20$ volts (represented by point 80 on the graph of FIG. 3), the field effect transistor is heavily conductive of current and provides a resistance of around 100 ohms in its source-drain path. Thus, when each of the control amplifiers 36, 38, 40 and 42 provides as its output voltage a control voltage $V_c$ of around $-20$ volts, each of the field effect transistors 26, 28, 30 and 32 provides a resistance of around 100 ohms in series with the associated resistor 16, 18, 20 or 22. Thus, there is provided between terminals 12 and 14 an overall resistance equal to the parallel resistance of the various circuit branches containing resistors 10, 16, 18, 20 and 22, i.e., the parallel resistance of resistances R, $R_1$+100, $R_2$+100, $R_3$+100 and $R_4$+100 ohms. This overall resistance is represented by portion 82 of the resistance versus master control voltage curve of FIG. 4b and, for the aforementioned exemplary resistance values, is around 168 ohms.

When the master control voltage $V_{MASTER\ CONTROL}$ has increased sufficiently so that the voltage at operational amplifier output terminal 51 of the first control amplifier 36 becomes less than $-10$ volts, Zener diode 60 no longer limits the operational amplifier output voltage. The voltage at terminal 51 then increases linearly as a function of further increases in the master control voltage $V_{MASTER\ CONTROL}$. Since the control amplifier output voltage at terminal 64 is 10 volts lower than the voltage at terminal 51, the output voltage from control amplifier 36 may be seen to also increase linearly as a function of the aforementioned further increases in the master control voltage $V_{MASTER\ CONTROL}$, as shown by curve portion 84 of FIG. 4a. It should be noted that when the master control voltage $V_{MASTER\ CONTROL}$ is equal to the reference voltage $V_{ref.1}$, the voltage applied to operational amplifier noninverting input terminal 75 is zero, and hence the voltage at operational amplifier output terminal 51 is also zero, the output voltage $V_{c1}$ of control amplifier 36 being $-10$ volts.

As the control voltage $V_{c1}$ increases from $-20$ volts toward zero volts, the field effect transistor 26 becomes less conductive of current, and its source-drain resistance increases gradually as shown by curve portion 86 of FIG. 3. Since the increased source-drain resistance of transistor 26 is in series with resistor 16, a larger resistance appears in parallel with the remaining branches of the resistance device of FIG. 1, and the overall resistance between terminals 12 and 14 increases as shown by curve portion 88 of FIG. 4b.

When the master control voltage $V_{MASTER\ CONTROL}$ has increased sufficiently so that the voltage at operational amplifier output terminal 51 of control amplifier 36 would be greater than +10 volts, limiting action of zener diode 58 occurs to limit the voltage at terminal 51 to around +10 volts. The output voltage $V_{c1}$ of control amplifier 36 is then limited to around zero volts, as shown by curve portion 90 of FIG. 4a.

As may be seen from FIG. 3, when the control voltage $V_{c1}$ is around 0 volts, the source-drain resistance of transistor 26 is greater than $10^{12}$ ohms. Since this resistance is substantially greater than the resistance $R_1$ of resistor 16, resistor 16 is effectively disconnected from the remaining resistive branches of the device of FIG. 1. The overall resistance between terminals 12 and 14 becomes the parallel resistance of the circuit branches containing resistors 10, 18, 20 and 22, i.e., the parallel resistance of resistances R, $R_2$+100, $R_3$+100 and $R_4$+100 ohms. This overall resistance is represented by curve portion 92 of FIG. 4b and, for the aforementioned exemplary resistance values, is around 380 ohms.

When the master control voltage $V_{MASTER\ CONTROL}$ has increased sufficiently so that the Zener diode 60 in the second control amplifier 38 no longer limits the voltage at terminal 51 of this amplifier, the output voltage $V_{c2}$ of the control amplifier 38 increases linearly from essentially $-20$ volts to 0 volts as a function of further increases in the master control voltage $V_{MASTER\ CONTROL}$, as shown by curve portion 94 of FIG. 4a. In response to this increase in the control voltage $V_{c2}$, field effect transistor 28 becomes less conductive of current, and its source-drain resistance increases. An increased resistance is thus presented in series with resistor 18, thereby providing a larger resistance in parallel with the remaining branches of the resistance device of FIG. 1, and increasing the overall resistance between terminals 12 and 14 as shown by curve portion 98 of FIG. 4b.

When the master control voltage $V_{MASTER\ CONTROL}$ has increased sufficiently so that the zener diode 58 in the control amplifier 38 functions to limit the control amplifier output voltage $V_{c2}$ to around 0 volts, as shown by curve portion 100 of FIG. 4a, the source-drain resistance of field effect transistor 28 is sufficiently high so that resistor 18 is effectively disconnected from the remaining resistive branches of the device of FIG. 1. The overall resistance between terminals 12 and 14 becomes the parallel resistance of circuit branches containing resistors 10, 20 and 22, i.e., the parallel resistance of resistances R, $R_3$+100, and $R_4$+100 ohms. This overall resistance is represented by curve portion 102 of FIG. 4b and, for the aforementioned exemplary resistance values, is around 805 ohms.

Operation of the control amplifier 40 and 42 and their associated field effect transistors 30 and 32, respectively, is essentially the same as that described above with respect to control amplifiers 36 and 38 and field effect transistors 26 and 28. Specifically, after a sufficient further increase in the master control voltage $V_{MASTER\ CONTROL}$, the output voltage $V_{c3}$ of control amplifier 40 increases linearly between essentially $-20$ volts and 0 volts along curve portion 104 of FIG. 4a as the master control voltage $V_{MASTER\ CONTROL}$ is increased. A gradually increasing overall resistance thus results between terminals 12 and 14, as represented by curve portion 108 of FIG. 4b, as the source-drain resistance of transistor 30 increases. When the voltage $V_{c3}$ has reached essentially zero volts, as shown by curve portion 110 of FIG. 4a, resistor 20 is effectively disconnected from the remaining resistive branches of the device of FIG. 1. The overall resistance between terminals 12 and 14 becomes the parallel resistance of the circuit branches containing resistors 10 and 22, i.e., the parallel resistance of resistances R and $R_4$+100 ohms. This overall resistance is represented by curve portion 112 of FIG. 4b and, for the aforementioned exemplary resistance values, is around 1.62 kΩ.

After a sufficient further increase in the master control voltage $V_{MASTER\ CONTROL}$, the output voltage $V_{c4}$ of the control amplifier 42 increases linearly between essentially −20 volts and zero volts along curve portion 114 of FIG. 4a as the master control voltage $V_{MASTER\ CONTROL}$ is increased. A gradually increasing overall resistance is thus produced between terminals 12 and 14, as represented by curve portion 118 of FIG. 4b, as the source-drain resistance of transistor 32 increases. When the voltage $V_{c4}$ has reached essentially zero volts, as shown by curve portion 120 of FIG. 4a, resistor 22 is effectively disconnected from the remaining resistive branch of the device of FIG. 1. The overall resistance between terminals 12 and 14 becomes essentially the resistance R of resistor 10 (3.3 kΩ in the aforementioned example), as represented by curve portion 122 of FIG. 4b.

It will be apparent from FIG. 4b that the aforedescribed electronically controlled variable resistance device of the present invention provides a resistance which increases with an increasing master control voltage according to a function which oscillates about a straight line [dashed line 130 in FIG. 4b]. When each of the field effect transistors 26, 28, 30 and 32 is either effectively cut off or conductive of current to essentially saturation, the overall resistance is determined almost completely by the resistance of one or more of the fixed resistors 10, 16, 18, 20 and 22, and corresponds to portions 82, 92, 102, 112 and 122 of the curve of FIG. 4b. Thus, the basic resistance accuracy of a device according to the invention is limited by the accuracy of the fixed resistors employed, and is essentially unaffected by variations in the field effect transistor characteristics.

When any of the field effect transistors 26, 28, 30 or 32 is in an intermediate, or transition, conductive condition, its resistance is comparable to that of the associated fixed series resistor, and the overall resistance of the device varies along portions 88, 98, 108 and 118 of the curve of FIG. 4b. It should be noted from FIG. 4b that the resistance versus master control voltage characteristic provided by the device of FIG 1 far more closely approximates a linear characteristic (dashed line 130) than if mere on-off type switching devices were employed in series with the fixed resistors, in which case the resultant resistance versus control voltage characteristic would be as illustrated by dashed lines 132 of FIG. 4b. In fact, a device according to the present invention can be made to approximate a linear function quite closely simply by increasing the number of resistor-field effect transistor branches in the circuit.

It is further pointed out that an electronically controllable resistance device according to the invention can be used to provide a resistance which varies according to a wide variety of functions of a master control voltage, the aforedescribed embodiment which involves an approximately linear function being merely illustrative of one exemplary relationship.

Thus, although the invention has been shown and described with reference to a particular embodiment, nevertheless various changes and modifications which are obvious to a person skilled in the art to which the invention pertains are deemed to lie within the purview of the invention.

What is claimed is:

1. An electronically controlled variable impedance device comprising: a plurality of electrical circuit branches connected in parallel, at least certain ones of said branches each including a controllable impedance element and an element providing a preselected fixed impedance connected in series; and a plurality of control amplifier means responsive to a common master control voltage and having respective outputs coupled to respective ones of said controllable impedance elements for providing a variable control voltage for the associated controllable impedance element over a preselected range of said master control voltage and for providing a first essentially constant control voltage for said controllable impedance element in response to a master control voltage below said preselected range and a second essentially constant control voltage for said controllable impedance element in response to a master control voltage above said preselected range, said first essentially constant control voltage being of a value to render said associated controllable impedance element heavily conductive of current, said second essentially constant control voltage being of a value to render said associated controllable impedance element essentially nonconductive of current, and said variable control voltage being in a range to render said associated controllable impedance element conductive of current at an intermediate level determined by the value of said master control voltage.

2. An electronically controlled variable resistance device comprising: a first resistor providing a preselected resistance and connected between first and second terminals; a plurality of electrical circuit branches connected in parallel with said first resistor between said first and second terminals, each of said branches including a resistor providing a predetermined fixed resistance and a controllable resistance element connected in series; and a plurality of control amplifier means responsive to a common master control voltage and having respective outputs coupled to respective ones of said controllable resistance elements for providing a variable control voltage for the associated controllable resistance element over a preselected range of said master control voltage and for providing a first essentially constant control voltage for said controllable resistance element in response to a master control voltage below said preselected range and a second essentially constant control voltage for said controllable resistance element in response to a master control voltage above said preselected range, said first essentially constant control voltage being of a value to render said associated controllable resistance element heavily conductive of current, said second essentially constant control voltage being of a value to render said associated controllable resistance element essentially nonconductive of current, and said variable control voltage being in a range to render said associated controllable resistance element conductive of current at an intermediate level determined by the value of said master control voltage.

3. An electronically controlled variable impedance device comprising: a plurality of electrical circuit branches connected in parallel, at least certain ones of said branches each including a controllable impedance element and an element providing a preselected fixed impedance connected in series; and a plurality of control amplifiers, each responsive to a common master control voltage and a different reference voltage and having a different preselected gain with the output of each control amplifier being coupled to a different one of said controllable impedance elements, for providing a linearly variable control voltage for the associated controllable impedance element over a preselected range of said master control voltage centered essentially at said reference voltage and for providing a first essentially constant control voltage for said controllable impedance element when said master control voltage is below said preselected range and a second essentially constant control voltage for said controllable impedance element when said master control voltage is below said preselected range and a second essentially constant control voltage for said controllable impedance element when said master control voltage is above said preselected range, said first essentially constant control voltage being of a value to render said associated controllable impedance element heavily conductive of current, said second essentially constant control voltage being of a value to render said associated controllable impedance element essentially nonconductive of current, and said linearly variable control voltage being in a range to render said associated controllable impedance element conductive of current at an intermediate level determined by the value of said master control voltage.

4. An electronically controlled variable impedance device comprising: a plurality of electrical circuit branches connected in parallel, at least certain ones of said branches each including a field effect transistor having its source-drain path connected in series with an element providing a preselected fixed impedance; a plurality of control amplifier means responsive to a common master control voltage and having respective outputs coupled to respective gate electrodes of said field effect transistors for providing a variable field effect transistor control voltage for the associated field effect transistor over a preselected range of said master control voltage and for providing a first essentially constant field effect transistor control voltage in response to a master control voltage below said preselected range and a second essentially constant field effect transistor control voltage in response to a master control voltage above said preselected range, said first essentially constant field effect transistor control voltage being of a value to render said associated field effect transistor heavily conductive of current, said second essentially constant field effect transistor control voltage being of a value to render said associated field effect transistor essentially nonconductive of current, and said variable field effect transistor control voltage being in a range to render said associated field effect transistor conductive of current at an intermediate level determined by the value of said master control voltage.

5. An electronically controlled variable impedance device according to claim 1 wherein each of said control amplifier means includes an operational amplifier, a voltage divider, means for applying said master control voltage to one terminal of said voltage divider, means for applying a reference voltage to another terminal of said voltage divider, and said voltage divider having an intermediate terminal coupled to a noninverting input terminal of said operational amplifier.

6. An electronically controlled variable impedance device according to claim 5 wherein said voltage divider includes a first voltage divider resistor connected between said one and said intermediate terminals, and a second voltage divider resistor connected between said another and said intermediate terminals, said first and second voltage divider resistors providing the same resistance.

7. An electronically controlled variable impedance device according to claim 5 wherein each of said control amplifier means further includes first and second zener diodes coupled in series in opposite polarity between an inverting input terminal and an output terminal of said operational amplifier, and a third zener diode coupled between said operational amplifier output terminal and an output terminal of said control amplifier means.

8. An electronically controlled variable impedance device according to claim 3 wherein each of said control amplifier means includes an operational amplifier having a noninverting input terminal, an inverting input terminal, and an output terminal; first and second resistors each having one terminal connected to said inverting input terminal; means for applying said master control voltage to another terminal of said first resistor; means for applying said reference voltage to another terminal of said second resistor; a third resistor connected between said inverting input terminal and said output terminal of said operational amplifier; fourth and fifth resistors connected in series, a terminal of said fifth resistor electrically remote from said fourth resistor being connected to said inverting input terminal; first and second zener diodes connected in series in opposite polarity between said output terminal of said operational amplifier and the junction between said fourth and fifth resistors; a third zener diode connected between said output terminal of said operational amplifier and an output terminal of said control amplifier means; a sixth resistor having one terminal connected to said output terminal of said control amplifier; and means for applying an operating potential between a terminal of said fourth resistor electrically remote from said fifth resistor and another terminal of said sixth resistor.

* * * * *

PO-1050
(5/69)

UNITED STATES PATENT OFFICE
CERTIFICATE OF CORRECTION

Patent No. 3,624,530 Dated November 30, 1971

Inventor(s) Robert Zwirn

It is certified that error appears in the above-identified patent and that said Letters Patent are hereby corrected as shown below:

Col. 2, line 45 "$V_{cw}$" should be --$V_{c2}$--.
Col. 3, line 59 "Zener" should be --zener--.
Col. 4, line 30, "Zener" should be --zener--;
Col. 4, line 58, "amplifier" should be --amplifiers--.

Col. 6, lines 63-64, delete "and a second essentially constant control voltage for said controllable impedance element when said master control voltage is above said preselected range".

Signed and sealed this 6th day of March 1973.

(SEAL)
Attest:

EDWARD M.FLETCHER,JR.
Attesting Officer

ROBERT GOTTSCHALK
Commissioner of Patents